(12) United States Patent
Petersen et al.

(10) Patent No.: US 12,210,147 B2
(45) Date of Patent: Jan. 28, 2025

(54) METHOD AND PROCESSING UNIT FOR ACTIVATING AT LEAST ONE DRIVE UNIT OF AT LEAST ONE DEFLECTION UNIT OF A MICROSCANNER DEVICE

(71) Applicant: Robert Bosch GmbH, Stuttgart (DE)

(72) Inventors: Andreas Petersen, Eningen (DE); Frank Schatz, Kornwestheim (DE); Hendrik Specht, Pliezhausen (DE); Thomas Kuenstle, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 502 days.

(21) Appl. No.: 17/620,468

(22) PCT Filed: Jul. 21, 2020

(86) PCT No.: PCT/EP2020/070543
§ 371 (c)(1),
(2) Date: Dec. 17, 2021

(87) PCT Pub. No.: WO2021/032386
PCT Pub. Date: Feb. 25, 2021

(65) Prior Publication Data
US 2022/0171182 A1  Jun. 2, 2022

(30) Foreign Application Priority Data
Aug. 20, 2019 (DE) .................. 10 2019 212 446.1

(51) Int. Cl.
*G02B 26/10* (2006.01)
*G09G 3/02* (2006.01)
(Continued)

(52) U.S. Cl.
CPC ......... *G02B 26/101* (2013.01); *G02B 26/105* (2013.01); *G09G 3/025* (2013.01);
(Continued)

(58) Field of Classification Search
CPC .... G02B 26/101; G02B 26/105; G09G 3/025; G09G 3/346; H04N 3/08; H04N 9/3135
See application file for complete search history.

(56) References Cited

U.S. PATENT DOCUMENTS

| 5,047,630 A | 9/1991 | Confer et al. |
| 5,546,214 A * | 8/1996 | Black ................... A61B 18/203 |
| | | 359/201.1 |

(Continued)

FOREIGN PATENT DOCUMENTS

| DE | 102004063554 A1 | 7/2006 |
| EP | 1508242 A1 | 2/2005 |

(Continued)

OTHER PUBLICATIONS

International Search Report for PCT/EP2020/070543, Issued Oct. 14, 2020.

*Primary Examiner* — Levi Gannon
(74) *Attorney, Agent, or Firm* — NORTON ROSE FULBRIGHT US LLP; Gerard A. Messina

(57) ABSTRACT

A method for activating a drive unit of a deflection unit of a two-dimensional microscanner device. First and second control signals for activating the drive unit of the deflection unit are initially generated using a processing unit. The first and second control signals are subsequently transferred to the drive unit. A sinusoidal first movement of the deflection unit about a first axis and a sinusoidal second movement of the deflection unit about a second axis are carried out at a first point in time based on the transferred control signals. The first control signals are then adapted so that a periodic third movement is superimposed on the first movement at a second point in time following the first point in time. Alternatively, the second control signals are adapted so that (Continued)

a periodic fourth movement is superimposed on the second movement at the second point in time following the first.

19 Claims, 7 Drawing Sheets

(51) Int. Cl.
*H03B 1/04* (2006.01)
*H04N 3/08* (2006.01)
*H04N 9/31* (2006.01)

(52) U.S. Cl.
CPC .............. *H03B 1/04* (2013.01); *H04N 3/08* (2013.01); *H04N 9/3135* (2013.01); *H03B 2200/007* (2013.01)

(56) References Cited

U.S. PATENT DOCUMENTS

| | | | |
|---|---|---|---|
| 6,118,569 A * | 9/2000 | Plesko | G02B 26/101 359/201.1 |
| 6,256,131 B1 * | 7/2001 | Wine | G02B 26/0858 359/291 |
| 8,842,352 B2 * | 9/2014 | Oettinger | G02B 26/105 359/224.1 |
| 2002/0149512 A1 | 10/2002 | Oki | |
| 2003/0015652 A1 | 1/2003 | Kandori et al. | |
| 2006/0158756 A1 * | 7/2006 | Hay | G03B 21/10 348/E9.026 |
| 2007/0279725 A1 | 12/2007 | Kato et al. | |
| 2009/0091666 A1 * | 4/2009 | Kurozuka | G09G 3/02 348/E9.026 |
| 2009/0092161 A1 * | 4/2009 | Hung | G03B 21/00 372/29.01 |
| 2011/0012874 A1 * | 1/2011 | Kurozuka | G02B 26/105 345/204 |
| 2012/0105432 A1 * | 5/2012 | Liao | H04N 9/3129 345/419 |
| 2013/0214620 A1 | 8/2013 | Kobayashi et al. | |
| 2014/0092151 A1 * | 4/2014 | Seno | G09G 3/346 345/698 |
| 2014/0340585 A1 * | 11/2014 | Heinzelmann | H04N 9/3129 348/744 |
| 2015/0109649 A1 | 4/2015 | Masuda | |
| 2017/0141628 A1 | 5/2017 | Nose et al. | |
| 2017/0248781 A1 * | 8/2017 | Ohyama | G02B 27/01 |
| 2018/0095266 A1 * | 4/2018 | Takahashi | H04N 9/3129 |
| 2019/0074739 A1 | 3/2019 | Brookes | |

FOREIGN PATENT DOCUMENTS

| | | |
|---|---|---|
| EP | 2107666 A2 | 10/2009 |
| EP | 2960708 A1 | 12/2015 |
| EP | 3193204 A1 | 7/2017 |
| JP | 2010117494 A | 5/2010 |
| WO | 03098918 A1 | 11/2003 |

* cited by examiner

METHOD AND PROCESSING UNIT FOR ACTIVATING AT LEAST ONE DRIVE UNIT OF AT LEAST ONE DEFLECTION UNIT OF A MICROSCANNER DEVICE

FIELD

The present invention relates to a method and a processing unit for activating at least one drive unit of at least one deflection unit of a microscanner device. Moreover, the present invention relates to a microscanner device that includes the processing unit according to the present invention.

BACKGROUND INFORMATION

European Patent No. EP 1 508 242 B1 describes the deflection of a light beam in order to project an image onto an image area. In the process, the light beam oscillates, in particular sinusoidally, in the horizontal and vertical directions and sweeps the image area in the form of a Lissajous figure. It is described how the trajectory uniformly or nonuniformly sweeps the image area via targeted phase shifts in the horizontal and vertical directions. The manipulation of frequencies, in particular in the vertical direction, is intended to counteract image errors. In addition, the image quality is enhanced by modulating the intensity of the light beam as a function of the location that it sweeps.

An object of the present invention is to provide a method and a processing unit for activating at least one drive unit of at least one deflection unit of a microscanner device, in which the trajectory sweeps the image area more uniformly and with higher resolution on average.

SUMMARY

The object may be achieved by providing a method for activating at least one drive unit of at least one deflection unit, in particular a micromirror, of a two-dimensional microscanner device according to an example embodiment of the present invention. First control signals for activating the drive unit of the at least one deflection unit are initially generated with the aid of at least one processing unit. In addition, second control signals for activating the drive unit of the at least one deflection unit are generated with the aid of the at least one processing unit. The first and/or second control signal may be electrical and/or pneumatic control signals, for example. The first and/or second control signal may also have a sinusoidal signal profile. However, the first and/or second control signal may also have a rectangular signal profile, for example. The first and second control signals are subsequently transferred from the processing unit to the at least one drive unit. A sinusoidal first movement of the at least one deflection unit about a first axis is then carried out at a first point in time as a function of the transferred first control signals. The sinusoidal first movement about the first axis is in particular a rotational movement of the at least one deflection unit about a horizontal axis. The at least one deflection unit is thus rotated about the first axis in such a way that the trajectory of a light beam that is deflected with the aid of the deflection unit extends in the vertical direction. In addition, a sinusoidal second movement of the at least one deflection unit about a second axis situated essentially perpendicularly with respect to the first axis is carried out at the first point in time as a function of the transferred second control signals. The sinusoidal second movement about the first axis is in particular a rotational movement of the at least one deflection unit about a vertical axis. The at least one deflection unit is thus rotated about the second axis in such a way that the trajectory of a light beam that is deflected with the aid of the deflection unit extends in the horizontal direction. The first control signals transferred from the processing unit to the at least one drive unit are adapted in such a way that a periodic third movement is superimposed on the first movement at a second point in time following the first point in time. Alternatively, the second control signals transferred from the processing unit to the at least one drive unit are adapted in such a way that a periodic fourth movement is superimposed on the second movement at the second point in time following the first point in time. For this purpose, for example the zero crossing of the first and/or second control signal may be changed. The periodic third movement superimposed on the first movement, and/or the periodic fourth movement superimposed on the second movement, may be designed as a rectangular movement profile, for example. The described method results in much better homogeneity of the scanning without clearly discernible areas having low resolution.

The sinusoidal first movement of the at least one deflection unit about the first axis is preferably carried out resonantly as a function of the transferred first control signals. The first control signals are then adapted in such a way that a controlled third movement as a periodic third movement is superimposed on this resonant first movement at the second point in time following the first point in time. Thus, the sinusoidal first movement is a movement whose frequency is significantly higher than the frequency of the superimposed third movement. As a result, the first movement specifies the actual profile of the movement about the first axis at the second point in time, and the third superimposed movement merely results in a shift of the first movement. Movements having a comparatively small amplitude require less power and may be generated more quickly. The sinusoidal first movement of the at least one deflection unit about the first axis preferably has a period duration $T_1$ as a function of the transferred first control signals. In this regard, the first control signals are adapted in such a way that the periodic third movement generated at the second point in time following the first point in time has a period duration $T_3$. The ratio of $T_1$ to $T_3$ is at most 1:50, preferably 1:10.

The first control signals are preferably adapted in such a way that a periodic rectangular third movement as a periodic third movement is superimposed on the first movement. Alternatively, the second control signals are adapted in such a way that a periodic rectangular fourth movement as a periodic fourth movement is superimposed on the second movement. The zero crossing of the first or second movement is thus merely shifted upwardly or downwardly, and at the second point in time the projected image is thus shifted as a whole. Alternatively, the first control signals are adapted in such a way that a triangular movement or a sawtooth-shaped movement or a further sinusoidal movement as a periodic third movement is superimposed on the first movement. Analogously, the second control signals are adapted in such a way that a triangular movement or a sawtooth-shaped movement or a further sinusoidal movement as a periodic fourth movement is superimposed on the second movement. The superimposed periodic third movement preferably has a constant third amplitude. Alternatively, the superimposed periodic fourth movement preferably has a constant fourth amplitude. An equal shift of the projected image may thus always be achieved, resulting in a uniformly high resolution of the projected image. Alternatively, the superimposed periodic third movement has a third amplitude that is not constant from one oscillation to the next. Analogously, the superimposed periodic fourth movement may also have a fourth amplitude that is not constant from one oscillation to the next. The projected image is thus nonuniformly shifted from one oscillation cycle to the next, as the result of which even better homogeneity of the projected image is achieved.

It is preferred that the sinusoidal first movement of the at least one deflection unit about the first axis is carried out at a defined first frequency $f_1$, and the sinusoidal second movement of the at least one deflection unit about the second axis is carried out at a defined second frequency $f_2$. As a function of frequencies $f_1$ and $f_2$, image points in the form of a Lissajous figure are then projected onto a provided, in particular rectangular, projection volume with the aid of the deflection unit. In the case of an integer ratio of frequencies $f_1$ and $f_2$, the trajectory moves upwardly one time and then downwardly, and subsequently closes and writes the image. Such a movement of the trajectory upwardly and then downwardly is referred to as one pass of the Lissajous figure. For a noninteger ratio of the frequencies, multiple passes are necessary until the Lissajous figure closes. For a noninteger ratio of 10.2, for example ($f_1$=3,000 Hz and $f_2$=30,600 Hz, for example), the trajectory goes downwardly and then upwardly until the number of these movements, multiplied by the frequency ratio, once again results in an integer value. Thus, for a ratio of 10.2:1, five passes would result until the Lissajous figure closes. The five passes are projected in such a way that another line is written with each pass. In this regard, the period of the superimposed periodic third or fourth movement preferably corresponds to the time for one pass of the Lissajous figure. Alternatively, the required time for one pass of the Lissajous figure may also correspond to a multiple of one period of the superimposed periodic third or fourth movement. The superimposed periodic third or fourth movement of the uniform movement of the Lissajous figure is preferably recreated, and corresponds, upwardly and downwardly, to a linear ramp. In this regard, the linear ramp preferably rises during the first pass of the Lissajous figure and falls once again during the next pass of the Lissajous figure. The second point in time following the first point in time preferably occurs as a function of a temporal profile of the sinusoidal first and/or second movement of the at least one deflection unit. The second point in time is thus established as a function of the detected time-dependent profile of the first and/or second movement. The second point in time is preferably reached after one-half of a period of the sinusoidal first and/or second movement. The second point in time is preferably established as a function of a detected rotation angle $\alpha_1$ of the at least one deflection unit about the first axis and of a detected rotation angle $\alpha_2$ of the at least one deflection unit about the second axis. However, the second point in time preferably also occurs directly at the start of the method, and thus simultaneously with the first point in time. The adaptation of the first or second control signals thus likewise takes place directly at the start of the method. The rotation angle is preferably continuously detected with the aid of sensors, for example, such as a camera or a capacitive sensor. To allow the temporal profile of the first and/or second movement to be ascertained only with the aid of a clock, all that is required, for example, is rotation angle $\alpha_1$ of the at least one deflection unit about the first axis detected at the first point in time, and/or rotation angle $\alpha_2$ of the at least one deflection unit, detected at the first point in time. If initial rotation angles $\alpha_1$ and $\alpha_2$ as well as frequencies $f_1$ and $f_2$ are known, the processing unit may detect therefrom the further temporal profile of the first and/or second movement merely via a clock. The second point in time is preferably reached after one-half of a period of the sinusoidal first and/or second movement.

A further subject matter of the present invention relates to a processing unit for activating at least one drive unit of at least one deflection unit, in particular a micromirror, of a two-dimensional microscanner device. In this regard, the processing unit is designed to transfer first control signals for generating a sinusoidal first movement, in particular a first rotational movement, of the at least one deflection unit about a first axis in particular about a horizontal axis to the at least one drive unit at a first point in time. In addition, the processing unit is used to transfer second control signals for generating a sinusoidal second movement, in particular a second rotational movement, of the at least one deflection unit about a second axis in particular about a vertical axis to the at least one drive unit at the first point in time. The first axis and the second axis are situated essentially perpendicularly with respect to one another. The processing unit is additionally designed to adapt the first control signals in such a way that a periodic third movement is superimposed on the first movement at a second point in time following the first point in time. Alternatively, the processing unit is designed to adapt the second control signals in such a way that a periodic fourth movement is superimposed on the second movement at the second point in time following the first point in time.

Furthermore, the processing unit is preferably designed to transfer the first control signals to the at least one drive unit in such a way that the sinusoidal first movement of the at least one deflection unit about the first axis is carried out resonantly. In this regard, the processing unit is also designed to adapt the first control signals in such a way that a controlled third movement as a periodic third movement is superimposed on the first movement at the second point in time following the first point in time.

The processing unit is preferably designed to generate the first control signals and transfer them to the at least one drive unit in such a way that the sinusoidal first movement has a defined period duration $T_1$. The processing unit is additionally designed to adapt the first control signals in such a way that the periodic third movement generated at the second point in time following the first point in time has a defined period duration $T_3$, the ratio of $T_1$ to $T_3$ being at most 1:50, in particular 1:10.

The processing unit is preferably designed to adapt the first control signals in such a way that a periodic rectangular third movement as a periodic third movement is superimposed on the first movement at the second point in time following the first point in time. Alternatively, the processing unit is used to adapt the second control signals in such a way that a periodic rectangular fourth movement, in particular having a constant fourth amplitude, as a periodic fourth movement is superimposed on the second movement at the second point in time following the first point in time.

In addition, the processing unit is preferably designed to generate the first control signals in such a way that the sinusoidal first movement of the at least one deflection unit about the first axis is carried out at a defined first frequency $f_1$. In this regard, the processing unit is also designed to generate the second control signals in such a way that the sinusoidal second movement of the at least one deflection unit about the second axis is carried out at a defined second frequency $f_2$. As a function of frequencies $f_1$ and $f_2$, image points in the form of a Lissajous figure are projected onto a provided, in particular rectangular, projection unit with the aid of the at least one deflection unit. The processing unit is designed to establish the second point in time following the first point in time as a function of a temporal profile of the sinusoidal first and/or second movement of the at least one deflection unit. The time-dependent profile of the first and/or second movement is thus known to the processing unit, and as a function of this profile the processing unit also knows when the first or second control signals must be adapted so that the third or fourth movement is superimposed on the first or second movement at the second point in time following the first point in time.

A further subject matter of the present invention relates to a microscanner device which includes the above-described processing unit for activating at least one drive unit of at least one deflection unit, in particular a micromirror, of the microscanner device. The microscanner device is in particular a two-dimensional microscanner device, which is thus designed to project the deflected light beam in two dimensions onto the projection volume. For this purpose, the microscanner device preferably includes a first deflection unit, in particular a first micromirror, together with an associated first drive unit, and a second deflection unit, in particular a second micromirror, together with an associated second drive unit. The first drive unit may be designed, for example, as a piezoelectric drive, and the second drive unit may be designed as an electromagnetic drive. The first deflection unit is designed to carry out a sinusoidal first movement, in particular a first rotational movement, about a first axis in particular a horizontal axis as a function of the transferred first control signals. The second deflection unit is designed to carry out a sinusoidal second movement, in particular a second rotational movement, about a second axis in particular a vertical axis as a function of the transferred second control signals. Alternatively, only a single deflection unit, in particular a micromirror, together with an associated drive unit is present, the deflection unit being designed to carry out the rotational movement about the first axis and also about the second axis. The drive unit may be designed, for example, as a combined piezoelectric and electromagnetic drive.

DETAILED DESCRIPTION OF EXAMPLE EMBODIMENTS

Figure 1:
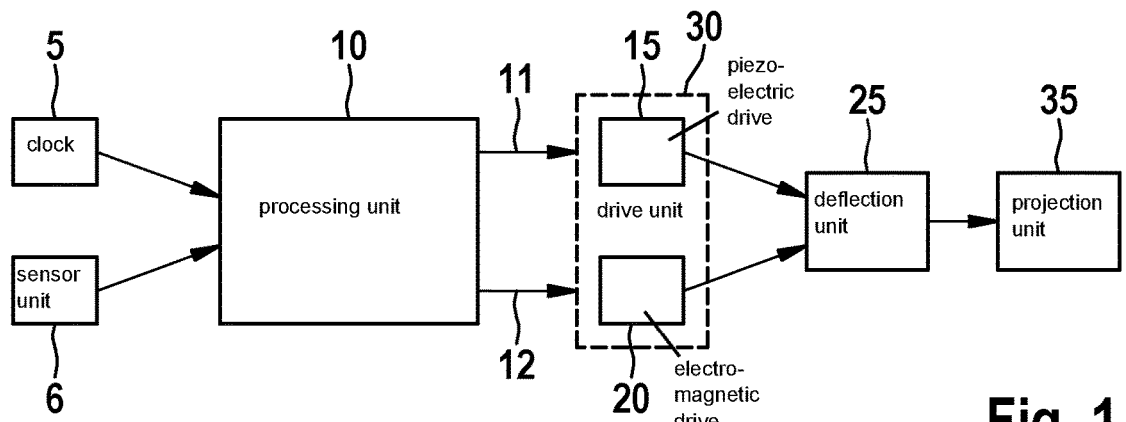
FIG. 1 schematically shows one specific embodiment of a processing unit for activating at least one drive unit of at least one deflection unit of a two-dimensional microscanner device, in accordance with the present invention.

FIG. 1 schematically shows one specific embodiment of a processing unit 10 for activating at least one drive unit 30 of at least one deflection unit 25, in particular a micromirror, of a two-dimensional microscanner device. In this specific embodiment, deflection unit 25 is designed as a single deflection unit 25 that is driven by a drive unit 30 that is designed as a combined piezoelectric drive 15 and electromagnetic drive 20. In this regard, processing unit 10 is designed to transfer first control signals 11 for generating a sinusoidal first movement, in particular a first rotational movement, of deflection unit 25 about a first axis in particular about a horizontal axis to drive unit 30 at a first point in time. In addition, processing unit 10 is used to transfer second control signals 12 for generating a sinusoidal second movement, in particular a second rotational movement, of deflection unit 25 about a second axis in particular about a vertical axis to drive unit 30 at the first point in time. The first axis and the second axis are situated essentially perpendicularly with respect to one another. Processing unit 10 is designed to adapt first control signals 11 in such a way that a periodic third movement is superimposed on the first movement at a second point in time following the first point in time. Alternatively, processing unit 10 is designed to adapt second control signals 12 in such a way that a periodic fourth movement is superimposed on the second movement at the second point in time following the first point in time.

Processing unit 10 is optionally designed to transfer first control signals 11 to the at least one drive unit 30 in such a way that the sinusoidal first movement of the at least one deflection unit 25 about the first axis takes place resonantly. In addition, in this regard processing unit 10 is used to adapt first control signals 11 in such a way that a controlled third movement as a periodic third movement is superimposed on the first movement at the second point in time following the first point in time.

In addition, processing unit 10 is optionally designed to generate first control signals 11 in such a way that the sinusoidal first movement of deflection unit 25 about the first axis takes place at a defined first frequency $f_1$. Processing unit 10 is likewise designed to generate second control signals 12 in such a way that the sinusoidal second movement of deflection unit 25 about the second axis takes place at a defined second frequency $f_2$. As a function of frequencies $f_1$ and $f_2$, image points in the form of a Lissajous figure are then projected onto a provided, in particular rectangular, projection unit 35 with the aid of deflection unit 25. Processing unit 10 is designed to establish the second point in time following the first point in time as a function of a temporal profile of the sinusoidal first and/or second movement of deflection unit 25. In order for processing unit 10 to know the temporal profile of the sinusoidal first and/or second movement of deflection unit 25, in this specific embodiment a clock 5 is provided. In addition, in this regard a sensor unit 6 is provided which is designed to detect instantaneous rotation angle $\alpha_1$ of deflection unit 25 about the first axis and instantaneous rotation angle $\alpha_2$ of deflection unit 25 about the second axis Sensor unit 6 may be a camera unit or a capacitive sensor, for example.

Figure 2:
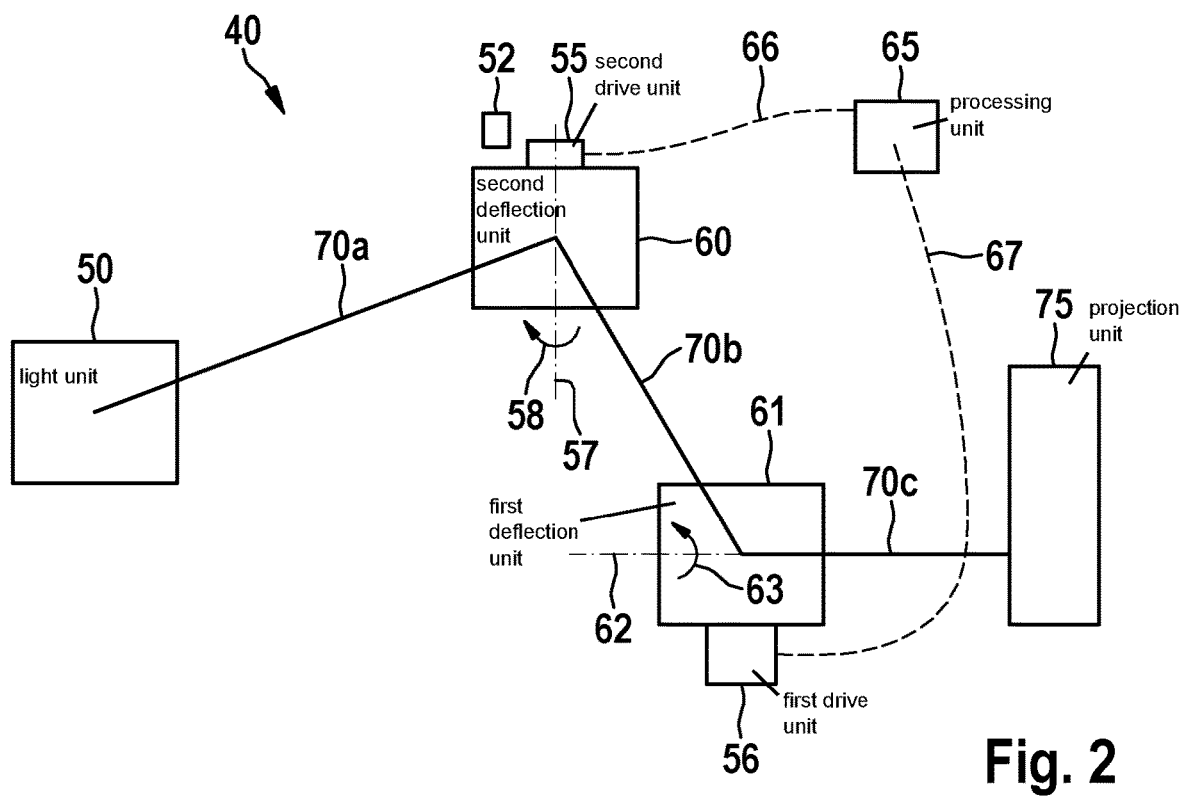
FIG. 2 schematically shows one specific embodiment of the microscanner device, in accordance with an example embodiment of the present invention.

FIG. 2 shows one specific embodiment of a microscanner device 40. A light unit 50, in particular a laser unit, of microscanner device 40 is designed to emit light beams 70a onto a second deflection unit 60. A second drive unit 55 is associated with second deflection unit 60. Processing unit 65 is designed to generate second control signals for activating second drive unit 55 of second deflection unit 60. As a function of the second control signals transferred with the aid of transfer line 66, a sinusoidal second rotational movement of second deflection unit 60 about a vertical axis as second axis 57 is carried out at a first point in time as a function of the transferred second control signals. As a result of the rotation of second deflection unit 60, light beam 70a is reflected onto first deflection unit 61 in a horizontal trajectory. A first drive unit 56 is associated with first deflection unit 61. Processing unit 65 is designed to generate first control signals for activating first drive unit 56 of first deflection unit 67. As a function of the first control signals transferred with the aid of transfer line 67, a sinusoidal first rotational movement of first deflection unit 61 about a horizontal axis as first axis 62 is carried out at the first point in time as a function of the transferred first control signals. Due to the additional rotation of first deflection unit 61 about first axis 62, light beam 70b is projected in the form of a Lissajous figure onto a provided rectangular projection unit 75.

Processing unit 65 is designed to adapt the first control signals in such a way that a periodic third movement is superimposed on the first movement at a second point in time following the first point in time.

Figure 3A:
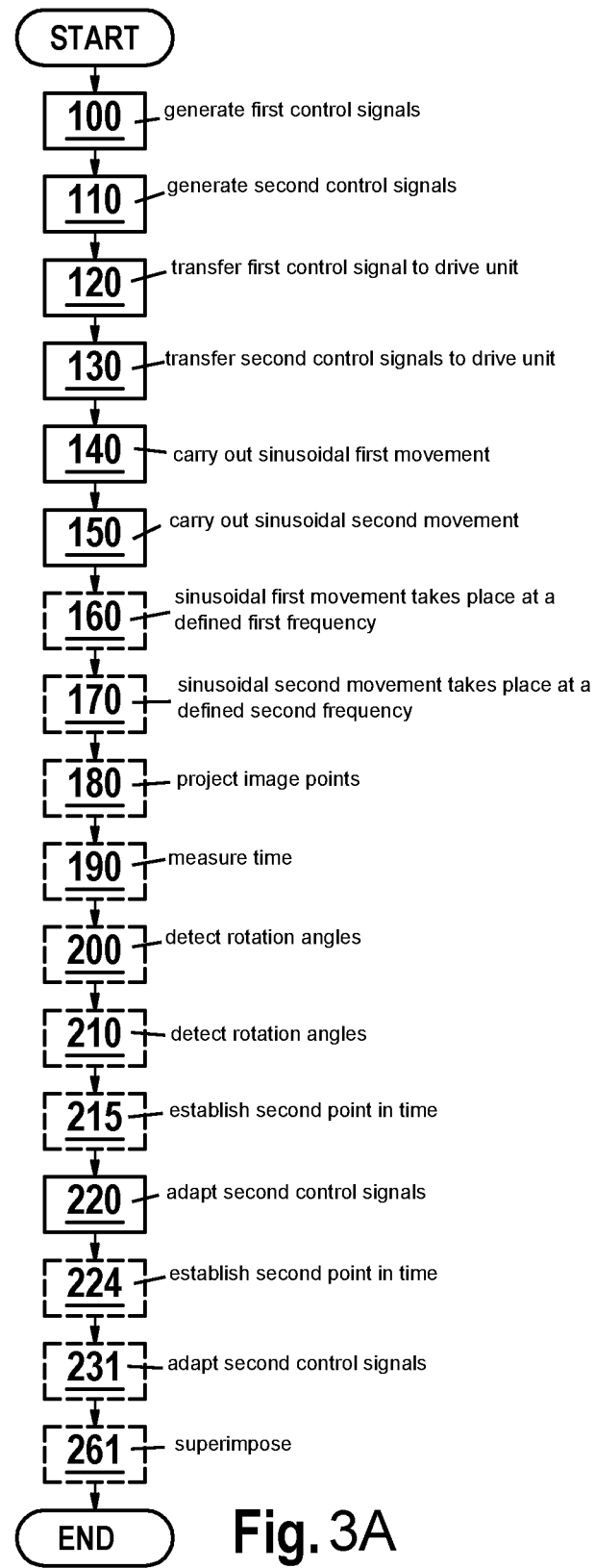
FIG. 3A shows a first specific embodiment of the method for activating at least one drive unit of at least one deflection unit of a two-dimensional microscanner device, in accordance with the present invention.

FIG. 3A shows in the form of a flowchart a first specific embodiment of a method for activating at least one drive unit of at least one deflection unit, in particular a micromirror, of a two-dimensional microscanner device. First control signals for activating the drive unit of the at least one deflection unit are generated in a method step 100 with the aid of at least one processing unit. Second control signals for activating the drive unit of the at least one deflection unit are generated in a subsequent method step 110 with the aid of the at least one processing unit. The first control signals are transferred from the at least one processing unit to the at least one drive unit in a subsequent method step 120. The second control signals are transferred from the at least one processing unit to the at least one drive unit in a method step 130. A sinusoidal first movement, in particular a first rotational movement, of the at least one deflection unit about a first axis in particular a horizontal axis is then carried out in a method step 140 at a first point in time as a function of the transferred first control signals. A sinusoidal second movement, in particular a second rotational movement, of the at least one deflection unit about a second axis in particular a horizontal axis is then carried out in a method step 150 at a first point in time as a function of the transferred second control signals. The second control signals transferred from the at least one processing unit to the at least one drive unit are adapted in a subsequent method step 220 in such a way that a periodic fourth movement is superimposed on the second movement at the second point in time following the first point in time. The method is then ended.

The sinusoidal first movement of the at least one deflection unit about the first axis takes place at a defined first frequency $f_1$ in an optional method step 160. The sinusoidal second movement of the at least one deflection unit about the second axis takes place at a defined second frequency $f_2$ in an optional method step 170. Image points in the form of a Lissajous figure are then projected onto a provided, in particular rectangular, projection volume in a method step 180 with the aid of the deflection unit.

The time is measured, beginning from the first point in time, in an optional method step 190 with the aid of a clock.

Since the processing unit knows frequencies $f_1$ and $f_2$ of the first and second movements, the second point in time may be determined in method step 215 with the aid of the processing unit as a function of the time measurement. In addition, rotation angle $\alpha_1$ of the at least one deflection unit about the first axis and rotation angle $\alpha_2$ of the at least one deflection unit about the second axis are detected at the first point in time in a further method step 200 with the aid of at least one sensor unit. The second point in time may thus be established even more accurately with the aid of the processing unit in method step 215. Rotation angle $\alpha_1$ of the at least one deflection unit about the first axis and rotation angle $\alpha_2$ of the at least one deflection unit about the second axis are detected continuously in a further method step 210 with the aid of the at least one sensor unit.

The second point in time is established in an optional method step 224 in such a way that the fourth movement is superimposed on the second rotational movement about the second axis after one-half of a pass of the projected Lissajous figure.

The second control signals are adapted in a further optional method step 231 in such a way that a periodic rectangular fourth movement as a periodic fourth movement is superimposed on the second movement. Alternatively, it is also possible, for example, to superimpose a periodic sinusoidal or triangular or sawtooth-shaped third movement as a periodic third movement.

In an optional method step 260, the superimposed fourth movement has a period duration $T_4$ which corresponds to a multiple of period duration $T_2$ of the second movement.

Figure 3B:
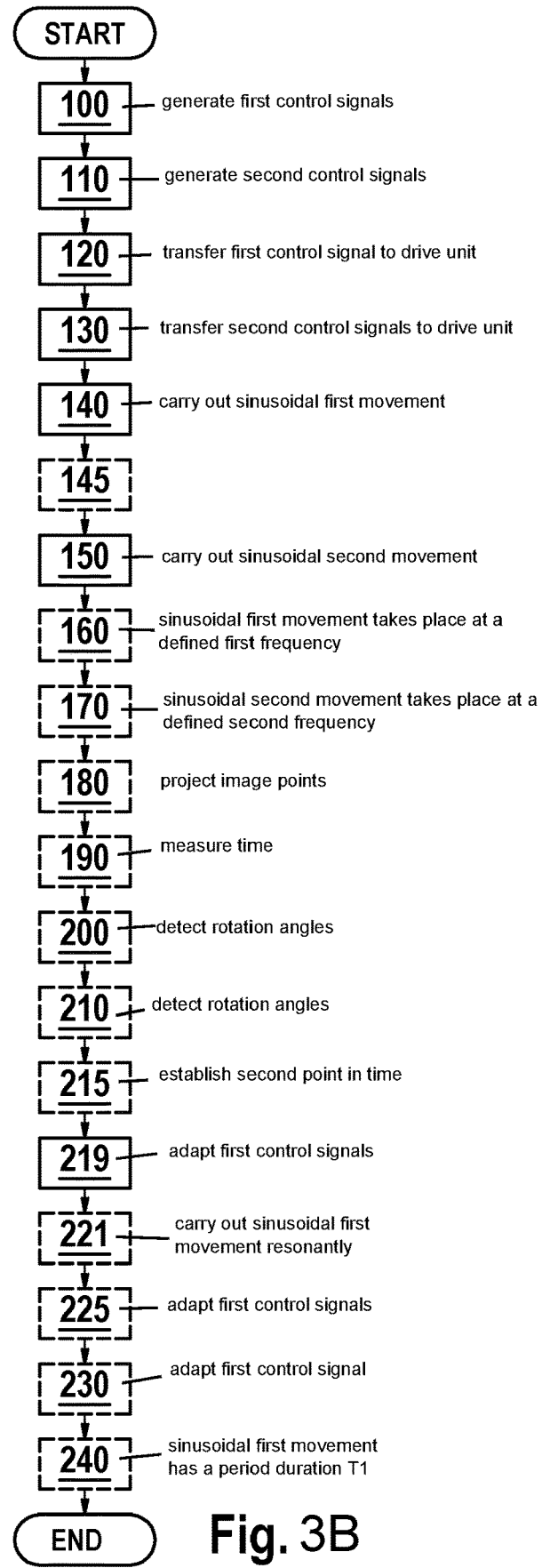
FIG. 3B shows a second specific embodiment of the method.

FIG. 3B shows in the form of a flowchart a second specific embodiment of the method for activating at least one drive unit of at least one deflection unit, in particular a micromirror, of a two-dimensional microscanner device. In contrast to the first specific embodiment, the first control signals transferred from the at least one processing unit to the at least one drive unit are adapted in method step 219 in such a way that a periodic third movement is superimposed on the first movement at a second point in time following the first point in time.

In addition, the sinusoidal first movement of the at least one deflection unit about the first axis is carried out resonantly in an optional method step 221. The first control signals are adapted in a subsequent method step 225 in such a way that a controlled third movement as a periodic third movement is superimposed on the first movement at the second point in time following the first point in time.

The first control signals are adapted in an optional method step 230 in such a way that a periodic rectangular third movement as a periodic third movement is superimposed on the first movement. Alternatively, it is also possible, for example, to superimpose a periodic sinusoidal or triangular or sawtooth-shaped third movement as a periodic third movement.

The sinusoidal first movement of the at least one deflection unit about the first axis as a function of the transferred first control signals has a period duration $T_1$ in an optional method step 240. The first control signals are adapted in such a way that the periodic third movement generated at the second point in time following the first point in time has a period duration $T_3$, so that the ratio of $T_1$ to $T_3$ is at least 1:8. In particular, the ratio is 1:1,000.

Figure 4A:
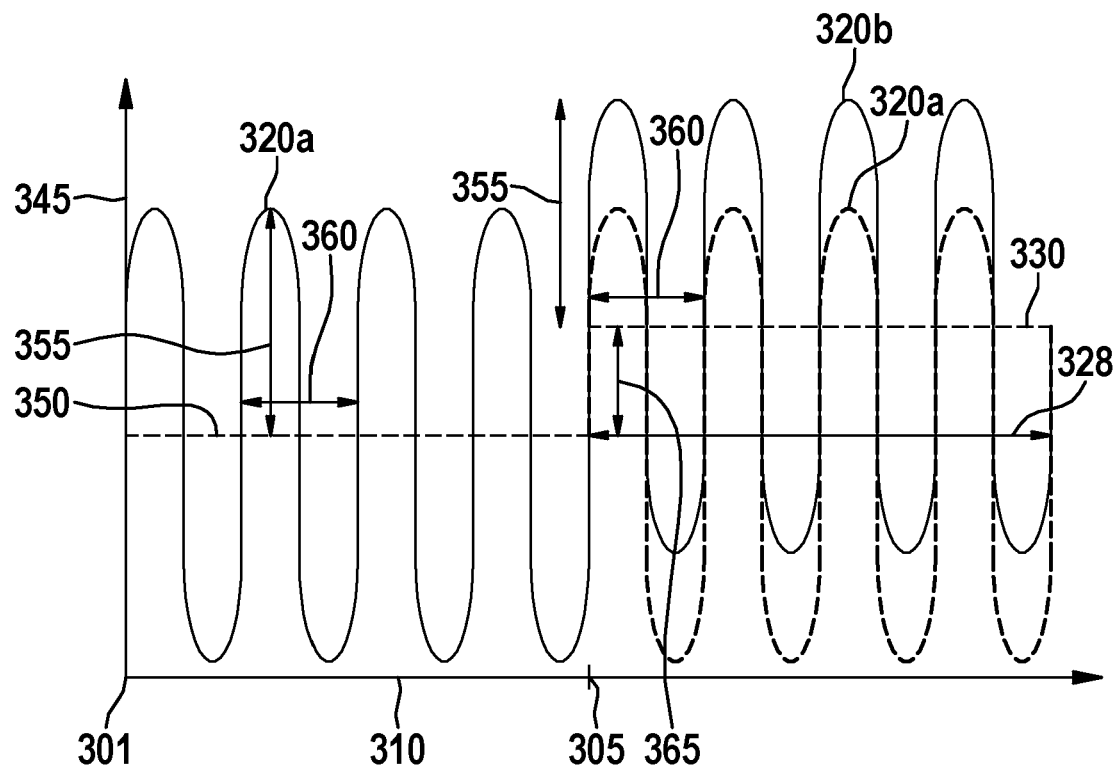
FIG. 4A shows one possible signal profile of the first movement.

FIG. 4A schematically shows by way of example the profile of a sinusoidal first rotational movement 320a and 320b of the at least one deflection unit about a first axis. The first axis is a horizontal axis Rotation angle $\alpha_1$ of the deflection unit about the first axis is plotted on Y axis 345, and time is plotted on X axis 310. From a first point in time 301 to a second point in time 305, sinusoidal first movement 320a extends uniformly about zero crossing 350 at a constant first amplitude 355 and with a constant period duration $T_1$ 360. However, beginning at second point in time 305, a third rectangular movement 330 is superimposed on sinusoidal first movement 320a. This third movement represents a controlled movement. The resulting overall movement 320b is a sinusoidal rotational movement, which in contrast to first rotational movement 320a is shifted upwardly by overall deflection 365 of the rectangular third movement. The zero crossing of resulting overall movement 320b is correspondingly shifted upwardly by overall deflection 365 of the rectangular third movement. In this exemplary embodiment, period duration $T_3$ 328 of the third movement is four times longer than period duration $T_1$ 360 of the first movement. First rotational movement 320a about the first axis takes place resonantly.

Figure 4B:
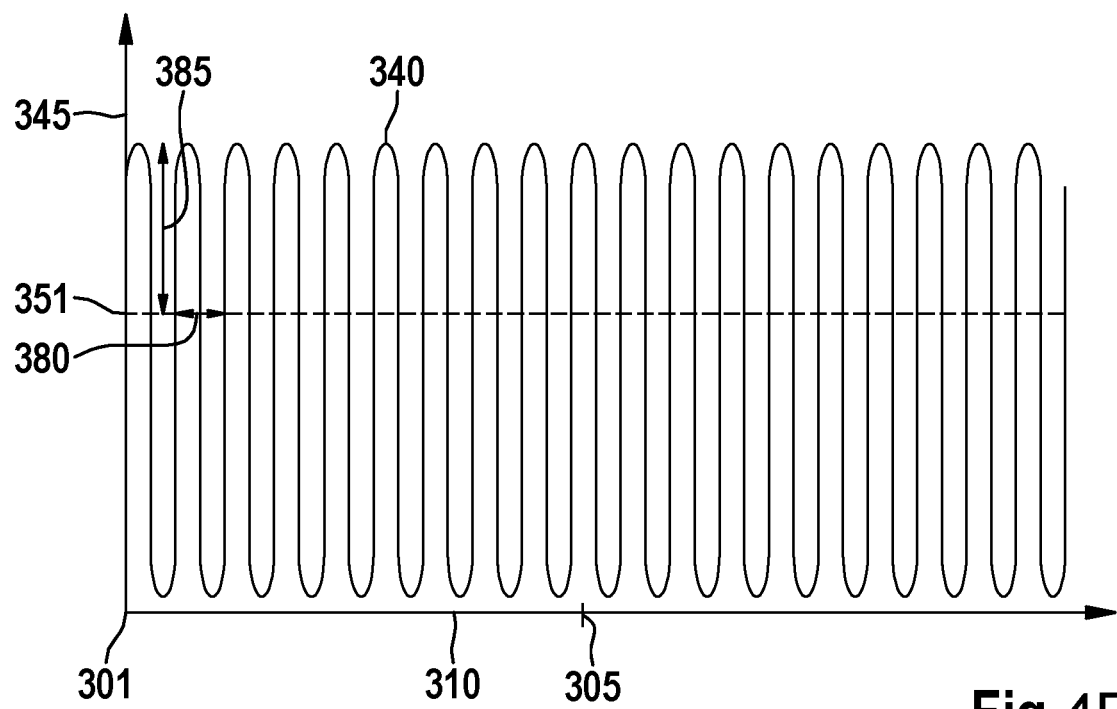
FIG. 4B shows an associated possible signal profile of the second movement.

FIG. 4B schematically shows by way of example the sinusoidal second rotational movement, associated with the first movement shown in FIG. 4A, of the at least one deflection unit about a vertical axis Rotation angle $\alpha_2$ of the deflection unit about the second axis is plotted on Y axis 345, and time is plotted on X axis 310. Second movement 340 has a uniform sinusoidal profile about zero crossing 351 over the entire course of time, with a second period duration $T_2$ and a constant second amplitude 385. Second period duration $T_2$ is significantly shorter than first period duration $T_1$.

Figure 4C:
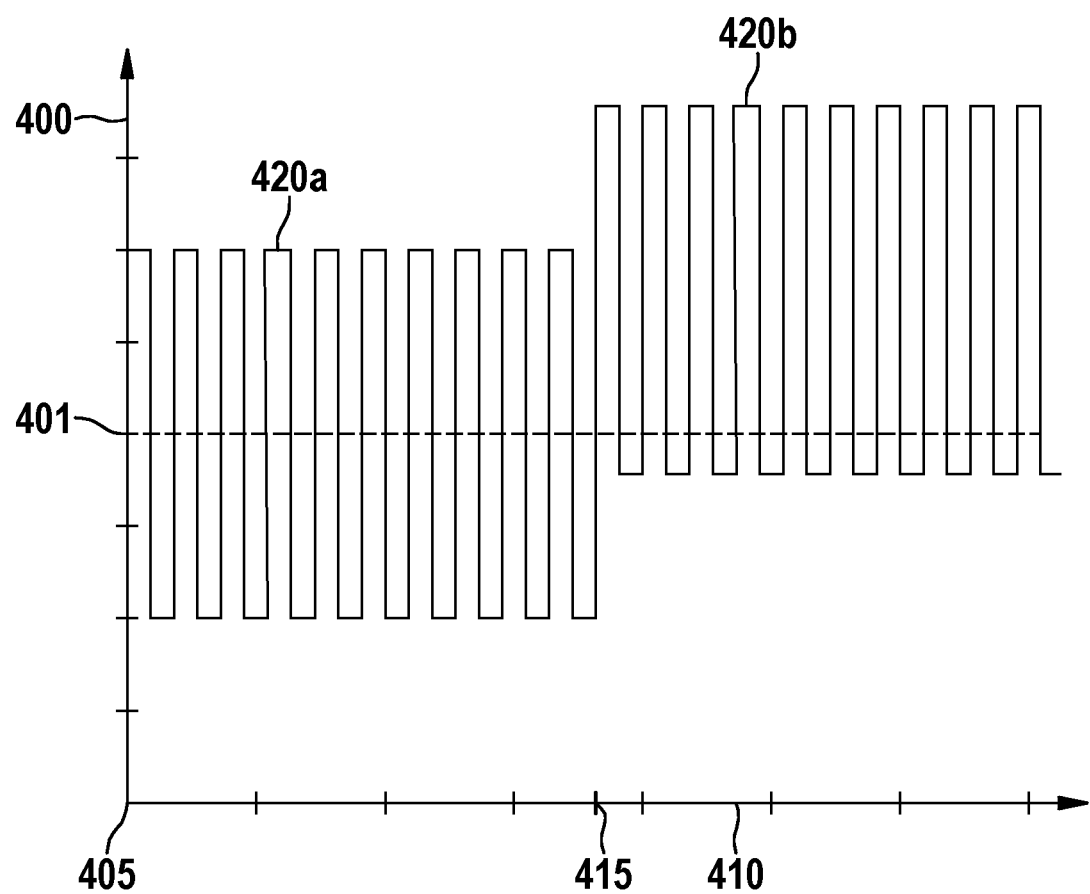
FIG. 4C shows an associated possible profile of the first control signals.

FIG. 4C schematically shows by way of example the profile of first control signals, generated with the aid of the processing unit for activating at least one drive unit of the at least one deflection unit, so that the rotational movement as shown in FIG. 4A may be carried out. The activation voltage is plotted on Y axis 400, and time is plotted on the X axis. In contrast to sinusoidal movement sequences 320a and 320b shown in FIG. 4A, signal profiles 420a and 420b extend with a rectangular shape. Time period 405 to 415 corresponds to the time period from first point in time 301 to second point in time 305 in FIG. 4A, except that rotational movements 320a and 320b are carried out in only a time-delayed manner on generated first control signals 420a and 420b. Signal profile 420a extends periodically about activation voltage 401 as a zero crossing. Activation voltage 401 generates a rotation angle $\alpha_1$, which corresponds to zero crossing 350 in FIG. 4A.

Figure 5B:
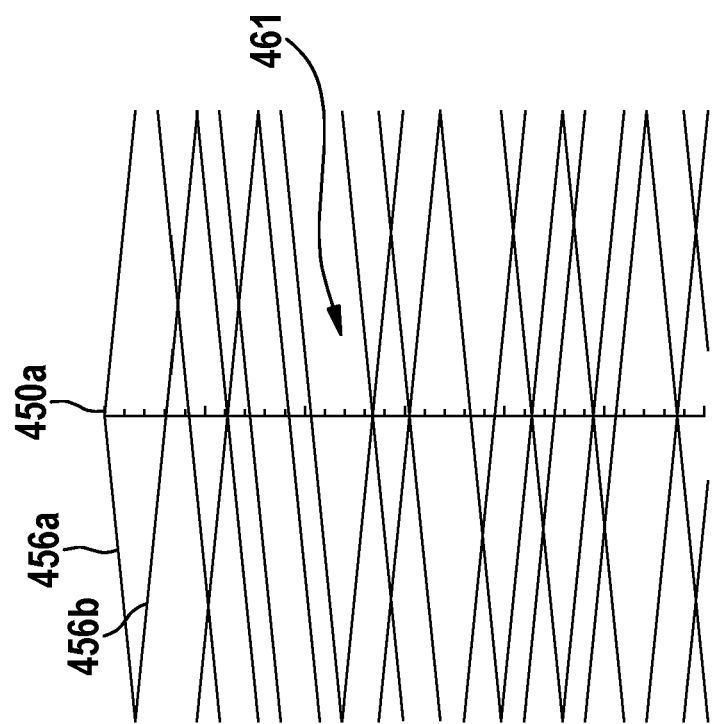
FIG. 5B shows a detail of a second projected Lissajous figure.
Figure 5A:
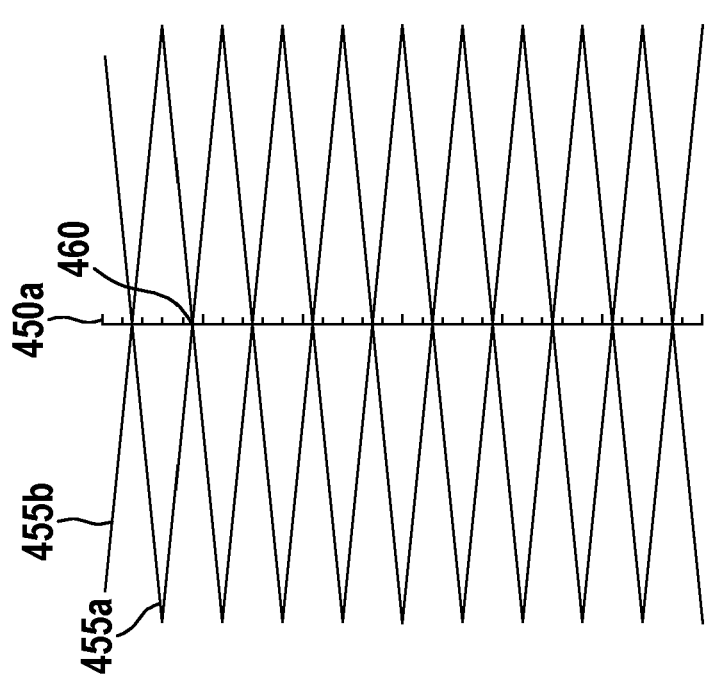
FIG. 5A shows a detail of a first projected Lissajous figure.

FIG. 5A shows a detail of the profile of trajectories 455a and 455b of projected image points in the form of a Lissajous figure. The detail shown here of a Lissajous figure was generated with a frequency ratio $f_1$ (frequency of the movement about the horizontal axis) to $f_2$ (frequency of the movement about a vertical axis) of 10.2:1. This means that the Lissajous figure has required five passes in order to be closed and generate an image. However, no adaptation of the first control signals was made. Trajectory 455a denotes the outward path, i.e., the pass of the Lissajous figure from bottom to top, and trajectory 455b denotes the return path, i.e., the pass of the Lissajous figure from top to bottom. For the axis in Y direction 450a an intersection 460 of trajectories 455a and 455b occurs, so that Y axis is intersected a total of 10 times in the detail shown.

FIG. 5B shows a detail of the profile of trajectories 456a and 456b of the projected image points in the form of a Lissajous figure. Trajectory 456a denotes the outward path, i.e., the pass of the Lissajous figure from bottom to top, and trajectory 456b denotes the return path, i.e., the pass of the Lissajous figure from top to bottom. Here as well, the shown detail corresponds to a Lissajous figure that was generated with a frequency ratio $f_1$ (frequency of the movement about the horizontal axis) to $f_2$ (frequency of the movement about the vertical axis) of 10.2:1. This means that here as well, the Lissajous figure has required five passes in order to be closed and generate an image. In contrast to FIG. 5A, an adaption of the first control signals was made, so that after 2.5 passes of the Lissajous figure, a periodic rectangular third movement as a periodic third movement is superimposed on the first movement. Thus, in contrast to trajectory 455b, trajectory 456b is shifted upwardly by the amplitude of the superimposed rectangular third movement. As a result, trajectories 456a and 456b scan the image much more homogeneously, and the axis in Y direction 450a is intersected a total of 15 times by trajectories 456a and 456b. Larger areas 461, not described for this pass of the Lissajous figure, may be described in the next pass by adaptation of the first control signals and a subsequent change of the superimposed third movement, so that on average all areas are described.

Figure 6:
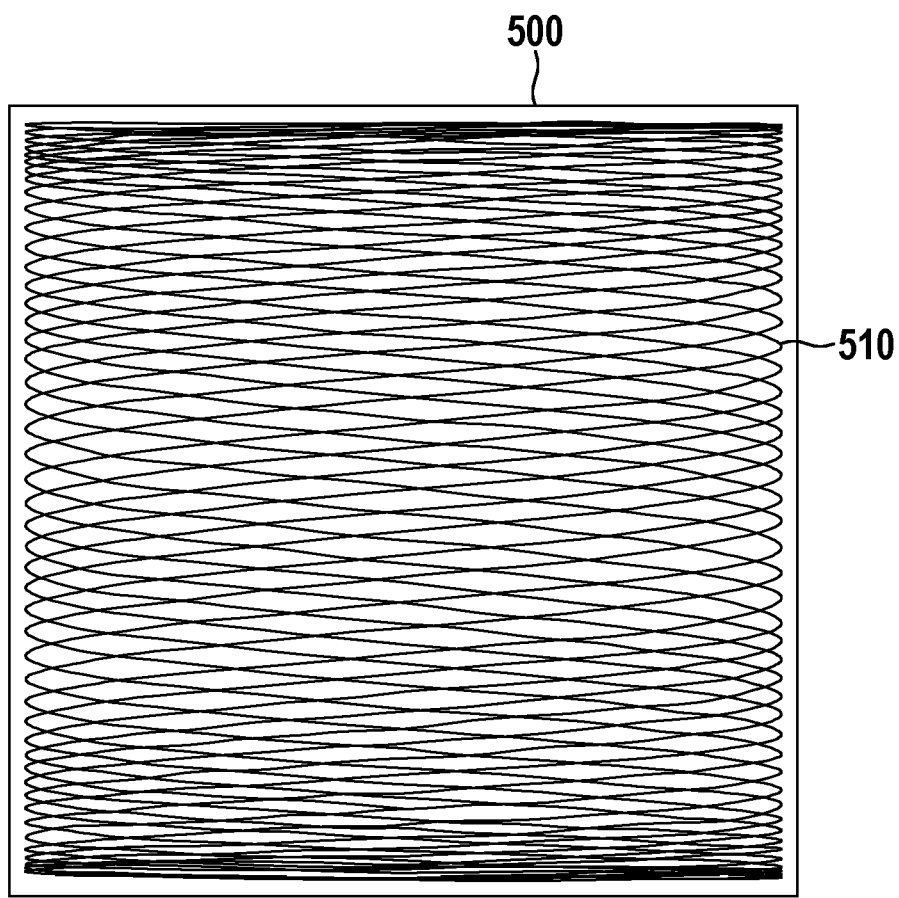
FIG. 6 shows image points in the form of a Lissajous figure on a projection unit.

FIG. 6 schematically shows a projection unit 500 on which image points in the form of a Lissajous FIG. 510 are projected. In this case, the first control signals are adapted in such a way that a periodic sinusoidal third movement as a periodic third movement is superimposed on the first movement. The superimposed sinusoidal third movement has a period duration $T_3$ that is equal to period duration $T_1$ of the first movement. However, the superimposed sinusoidal third movement is phase-shifted with respect to the first movement.

What is claimed is:

1. A method for activating at least one drive unit of at least one deflection unit of a two-dimensional microscanner device, the method comprising:
   generating first control signals for activating the at least one drive unit of the at least one deflection unit, using at least one processing unit;
   generating second control signals for activating the at least one drive unit of the at least one deflection unit, using the at least one processing unit;
   transferring the first control signals from the at least one processing unit to the at least one drive unit;
   transferring the second control signals from the at least one processing unit to the at least one drive unit;
   detecting, via a sensor unit, a rotation angle of the at least one deflection unit about a first axis and another rotation angle of the at least one deflection unit about a second axis;
   carrying out a sinusoidal first movement of the at least one deflection unit about the first axis at a first point in time as a function of the transferred first control signals, the first axis being a horizontal axis wherein a second point in time is established as a function of a detected rotation angle of the at least one deflection unit about the first axis and of another detected rotation angle of the at least one deflection unit about the second axis;
   carrying out a sinusoidal second movement of the at least one deflection unit about the second axis situated perpendicularly with respect to the first axis at the first point in time, wherein the second axis is a vertical axis; and
   (i) adapting the first control signals transferred from the at least one processing unit to the at least one drive unit so that a periodic third movement is superimposed on the first movement at a second point in time following the first point in time, or (ii) adapting the second control signals transferred from the at least one processing unit to the at least one drive unit so that a periodic fourth movement is superimposed on the second movement at the second point in time following the first point in time.

2. The method as recited in claim 1, wherein the at least one deflection unit is at least one micromirror.

3. The method as recited in claim 1, wherein the sinusoidal first movement and the sinusoidal second movement are first and second rotational movements.

4. The method as recited in claim 1, wherein the sinusoidal first movement of the at least one deflection unit about the first axis is carried out resonantly as a function of the transferred first control signals, and the first control signals are adapted so that a controlled third movement as the periodic third movement is superimposed on the first movement at the second point in time following the first point in time.

5. The method as recited in claim 1, wherein the sinusoidal first movement of the at least one deflection unit about the first axis as a function of the transferred first control signals has a period duration $T_1$, and the first control signals are adapted so that the periodic third movement generated at the second point in time following the first point in time has a period duration $T_3$, a ratio of $T_1$ to $T_3$ being at least 1:8.

6. The method as recited in claim 5, wherein the ratio is 1:1,000.

7. The method as recited in claim 1, wherein:
the first control signals are adapted so that a periodic rectangular third movement as the periodic third movement is superimposed on the first movement, or
the second control signals are adapted so that a periodic rectangular fourth movement as the periodic fourth movement is superimposed on the second movement.

8. The method as recited in claim 1, wherein the sinusoidal first movement of the at least one deflection unit about the first axis takes place at a defined first frequency, and the sinusoidal second movement of the at least one deflection unit about the second axis takes place at a defined second frequency, image points in the form of a Lissajous figure being projected onto a provided rectangular projection volume using the deflection unit.

9. The method as recited in claim 8, wherein the second point in time following the first point in time occurs as a function of a temporal profile of the sinusoidal first movement and/or second movement of the at least one deflection unit.

10. The method as recited in claim 8, wherein the second point in time following the first point in time is established as a function of the rotation angle of the at least one deflection unit about the first axis detected at the first point in time, and/or of the rotation angle of the at least one deflection unit detected at the first point in time.

11. The method as recited claim 8, wherein the second point in time following the first point in time is established as a function of a detected rotation angle of the at least one deflection unit about the first axis and of another detected rotation angle of the at least one deflection unit about the second axis.

12. A processing apparatus configured to activate at least one drive unit of at least one deflection unit of a two-dimensional microscanner device, comprising:
a processing unit being configured to perform the following:
transferring first control signals for generating a sinusoidal first movement of the at least one deflection unit about a first axis to the at least one drive unit at a first point in time;
transferring second control signals for generating a sinusoidal second movement of the at least one deflection unit about a second axis to the at least one drive unit at the first point in time, the first axis and the second axis being situated perpendicularly with respect to one another;
detecting, via a sensor unit, a rotation angle of the at least one deflection unit about a first axis and another rotation angle of the at least one deflection unit about a second axis; and
(i) adapting the first control signals so that a periodic third movement is superimposed on the first movement at a second point in time following the first point in time, or (ii) adapting the second control signals so that a periodic fourth movement is superimposed on the second movement at the second point in time following the first point in time;
wherein the second point in time is established as a function of a detected rotation angle of the at least one deflection unit about the first axis and of another detected rotation angle of the at least one deflection unit about the second axis.

13. The processing apparatus as recited in claim 12, wherein the at least one deflection unit is at least one micromirror.

14. The processing apparatus as recited in claim 12, wherein the processing unit is configured to perform the following:
transferring the first control signals to the at least one drive unit so that the sinusoidal first movement of the at least one deflection unit about the first axis takes place resonantly; and
adapting the first control signals so that a controlled third movement as the periodic third movement is superimposed on the first movement at the second point in time following the first point in time.

15. The processing apparatus as recited in claim 12, wherein the processing unit is configured to generate the first control signals and transfer the first control signals to the at least one drive unit so that the sinusoidal first movement has a period duration $T_1$, the processing unit being designed to adapt the first control signals so that the periodic third movement generated at the second point in time following the first point in time has a defined period duration $T_3$, a ratio of $T_1$ to $T_3$ being at least 1:8.

16. The processing apparatus as recited in claim 12, wherein:
the processing unit is configured to adapt the first control signals so that a periodic rectangular third movement as the periodic third movement is superimposed on the first movement at the second point in time following the first point in time; or
the processing unit is configured to adapt the second control signals so that a periodic rectangular fourth movement as the periodic fourth movement is superimposed on the second movement at the second point in time following the first point in time.

17. The processing apparatus as recited in claim 12, wherein the processing unit is configured to perform the following:
generating the first control signals so that the sinusoidal first movement of the at least one deflection unit about the first axis takes place at a defined first frequency, and
generating the second control signals so that the sinusoidal second movement of the at least one deflection unit about the second axis takes place at a defined second frequency, image points in the form of a Lissajous figure being projected onto a provided rectangular projection unit using the deflection unit, the processing unit being configured to establish the second point in time following the first point in time as a function of a temporal profile of the sinusoidal first movement and/or second movement of the at least one deflection unit.

18. A microscanner device, comprising:
a processing unit configured to activate at least one drive unit of at least one deflection unit, by performing the following:
   transferring first control signals for generating a sinusoidal first movement of the at least one deflection unit about a first axis to the at least one drive unit at a first point in time;
   transferring second control signals for generating a sinusoidal second movement of the at least one deflection unit about a second axis to the at least one drive unit at the first point in time, the first axis and the second axis being situated perpendicularly with respect to one another;
   detecting, via a sensor unit, a rotation angle of the at least one deflection unit about a first axis and another rotation angle of the at least one deflection unit about a second axis; and
   (i) adapting the first control signals so that a periodic third movement is superimposed on the first movement at a second point in time following the first point in time, or (ii) adapting the second control signals so that a periodic fourth movement is superimposed on the second movement at the second point in time following the first point in time;
   wherein the second point in time is established as a function of a detected rotation angle of the at least one deflection unit about the first axis and of another detected rotation angle of the at least one deflection unit about the second axis.

19. The microscanner device as recited in claim 18, further comprising:
a first deflection unit;
a first drive unit associated with the first deflection unit;
a second deflection unit; and
a second drive unit associated with the second deflection unit.

* * * * *